(12) United States Patent
Ye et al.

(10) Patent No.: US 10,403,535 B2
(45) Date of Patent: Sep. 3, 2019

(54) METHOD AND APPARATUS OF PROCESSING WAFERS WITH COMPRESSIVE OR TENSILE STRESS AT ELEVATED TEMPERATURES IN A PLASMA ENHANCED CHEMICAL VAPOR DEPOSITION SYSTEM

(71) Applicant: Applied Materials, Inc., Santa Clara, CA (US)

(72) Inventors: Zheng John Ye, Santa Clara, CA (US); Jay D. Pinson, II, San Jose, CA (US); Hiroji Hanawa, Sunnyvale, CA (US); Jianhua Zhou, Campbell, CA (US); Xing Lin, San Jose, CA (US); Ren-Guan Duan, Fremont, CA (US); Kwangduk Douglas Lee, Redwood City, CA (US); Bok Hoen Kim, San Jose, CA (US); Swayambhu P. Behera, Santa Clara, CA (US); Sungwon Ha, Palo Alto, CA (US); Ganesh Balasubramanian, Sunnyvale, CA (US); Juan Carlos Rocha-Alvarez, San Carlos, CA (US); Prashant Kumar Kulshreshtha, San Jose, CA (US); Jason K. Foster, San Jose, CA (US); Mukund Srinivasan, Fremont, CA (US); Uwe P. Haller, San Jose, CA (US); Hari K. Ponnekanti, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 631 days.

(21) Appl. No.: 14/824,229

(22) Filed: Aug. 12, 2015

(65) Prior Publication Data

US 2016/0049323 A1 Feb. 18, 2016

Related U.S. Application Data

(60) Provisional application No. 62/038,085, filed on Aug. 15, 2014.

(51) Int. Cl.
| | |
|---|---|
| *H02N 13/00* | (2006.01) |
| *H01L 21/683* | (2006.01) |
| *H01L 21/687* | (2006.01) |

(52) U.S. Cl.
CPC .... *H01L 21/6833* (2013.01); *H01L 21/68757* (2013.01); *H02N 13/00* (2013.01)

(58) Field of Classification Search
CPC .......... H01L 21/6833; H01L 21/68757; H02N 13/00
(Continued)

(56) References Cited

U.S. PATENT DOCUMENTS

| | | |
|---|---|---|
| 4,766,097 A | 8/1988 | Shinozaki et al. |
| 5,413,360 A | 5/1995 | Atari et al. |

(Continued)

FOREIGN PATENT DOCUMENTS

| | | |
|---|---|---|
| CN | 101030550 A | 9/2007 |
| CN | 101118865 A | 2/2008 |

(Continued)

OTHER PUBLICATIONS

International Search Report and Written Opinion for International Application No. PCT/US2015/044810 dated Nov. 24, 2015.

(Continued)

*Primary Examiner* — Kevin J Comber
(74) *Attorney, Agent, or Firm* — Patterson + Sheridan LLP

(57) ABSTRACT

Embodiments of the present disclosure provide an electrostatic chuck for maintaining a flatness of a substrate being processed in a plasma reactor at high temperatures. In one (Continued)

embodiment, the electrostatic chuck comprises a chuck body coupled to a support stem, the chuck body having a substrate supporting surface, and the chuck body has a volume resistivity value of about $1 \times 10^7$ ohm-cm to about $1 \times 10^{15}$ ohm-cm in a temperature of about 250° C. to about 700° C., and an electrode embedded in the body, the electrode is coupled to a power supply. In one example, the chuck body is composed of an aluminum nitride material which has been observed to be able to optimize chucking performance around 600° C. or above during a deposition or etch process, or any other process that employ both high operating temperature and substrate clamping features.

17 Claims, 6 Drawing Sheets

(58) Field of Classification Search
USPC .......................................................... 361/234
See application file for complete search history.

(56) References Cited

U.S. PATENT DOCUMENTS

| | | | |
|---|---|---|---|
| 5,777,543 | A | 7/1998 | Aida et al. |
| 6,001,760 | A | 12/1999 | Katsuda et al. |
| 6,094,334 | A | 7/2000 | Bedi et al. |
| 6,486,085 | B1* | 11/2002 | Katsuda ................ C04B 35/581 |
| | | | 257/E23.009 |
| 7,042,697 | B2 | 5/2006 | Tsuruta et al. |
| 2001/0003271 | A1* | 6/2001 | Otsuki ................ C23C 16/4404 |
| | | | 118/723 I |
| 2002/0165079 | A1 | 11/2002 | Katsuda et al. |
| 2003/0215962 | A1 | 11/2003 | Hausmann et al. |
| 2005/0150866 | A1* | 7/2005 | O'Donnell .......... C23C 16/4404 |
| | | | 216/67 |
| 2005/0152089 | A1* | 7/2005 | Matsuda ................ H02N 13/00 |
| | | | 361/234 |
| 2007/0217117 | A1 | 9/2007 | Ohta et al. |
| 2008/0017104 | A1 | 1/2008 | Matyushkin et al. |
| 2008/0029032 | A1 | 2/2008 | Sun et al. |
| 2008/0037194 | A1* | 2/2008 | Kamitani ............ H01L 21/6831 |
| | | | 361/234 |
| 2009/0107635 | A1 | 4/2009 | Kano et al. |
| 2009/0284894 | A1 | 11/2009 | Cooke |
| 2013/0279066 | A1 | 10/2013 | Lubomirsky et al. |

FOREIGN PATENT DOCUMENTS

| | | |
|---|---|---|
| JP | H0547906 A | 2/1993 |
| JP | H07226431 A | 8/1995 |
| JP | H0870036 A | 3/1996 |
| JP | H09312570 A | 12/1997 |
| JP | H1072260 A | 3/1998 |
| JP | 2000-091247 A | 3/2000 |
| JP | 2000332090 A | 11/2000 |
| JP | 2001-163672 A | 6/2001 |
| JP | 2001181050 A | 7/2001 |
| JP | 2002249379 A | 9/2002 |
| JP | 2003-012376 A | 1/2003 |
| JP | 2003-221279 A | 8/2003 |
| JP | 2003313078 A | 11/2003 |
| JP | 2006287210 A | 10/2006 |
| JP | 2008-042197 A | 2/2008 |
| JP | 2008182129 A | 8/2008 |
| JP | 2009111005 A | 5/2009 |
| JP | 2011061049 A | 3/2011 |
| KR | 2002-0050710 A | 6/2002 |
| KR | 2007-0090701 A | 9/2007 |
| WO | 9814999 | 4/1998 |

OTHER PUBLICATIONS

Japanese Notice of Reasons for Refusal, dated Jun. 10, 2019 for Application No. 2017-507985.
Search Report dated Jun. 3, 2019 for Application No. 2017-507985.

* cited by examiner

METHOD AND APPARATUS OF PROCESSING WAFERS WITH COMPRESSIVE OR TENSILE STRESS AT ELEVATED TEMPERATURES IN A PLASMA ENHANCED CHEMICAL VAPOR DEPOSITION SYSTEM

CROSS-REFERENCE TO RELATED APPLICATIONS

This application claims benefit of U.S. provisional patent application Ser. No. 62/038,085, filed Aug. 15, 2014, which is herein incorporated by reference

BACKGROUND

Field

Embodiments of the present disclosure generally relate to an apparatus and method for processing semiconductor substrates. More particularly, embodiments of the present disclosure relate to an electrostatic chuck used in a plasma chamber.

Description of the Related Art

Plasma enhance processes, such as plasma enhanced chemical vapor deposition (PECVD) process, high density plasma chemical vapor deposition (HDPCVD) process, plasma immersion ion implantation process (P3I), and plasma etch process, have become essential in semiconductor processing. Plasma provides many advantages in manufacturing semiconductor devices. For example, using plasma enables a wide range of applications due to lowered processing temperature, plasma enhanced deposition has excellent gap-fill for high aspect ratio gaps and high deposition rates.

One problem that occurs during plasma processing is deformation of a substrate being processed, especially for a device substrate, i.e. a patterned substrate at high temperatures. Semiconductor devices are formed by stacking layers of materials by certain pattern on a semiconductor substrate. A patterned substrate may "bow" during processes due to differences in thermal expansion among layers of different materials, particularly when the substrate is being heated. Bowing of the substrate may lead to non-uniformity of the process surface. Sides and back of a bowed substrate may be processed which not only wastes processing material, as precursors for plasma processing are usually very expensive, but also causes contaminations and other troubles for subsequent process steps.

External means, such as an electrostatic chuck (ESC), are used to hold the substrate against the ESC surface during semiconductor processing so that the wafer would not move, and would keep consistent thermal and electrical contact with respect to the ESC. Most importantly, the ESC keeps the substrate flat during semiconductor processing. It is critical for PECVD applications that the substrate temperature and voltage be consistent during process and from substrate to substrate. It is of particular interest when the incoming substrate exhibits certain degree of compressive bow or tensile bow prior to being clamped to the ESC, and high operating temperature would further make the bow change, i.e., may be worse than the incoming bow due to substrate surface stress changes at high temperatures. In such a case, a chucked substrate may still become deformed during a plasma process due to high operating temperature.

Therefore, there is a need for an apparatus and method for clamping a substrate while maintaining flatness of the substrate during high operating temperature.

SUMMARY OF THE DISCLOSURE

Embodiments of the present disclosure generally provide an electrostatic chuck (ESC) and method for clamping a substrate against a dielectric ESC surface, and subsequently releasing the same substrate from the dielectric ESC surface, where the substrate becomes substantially flat and is maintained substantially parallel with respect to the ESC surface, regardless of whether the substrate is flat, or, it might have exhibited various degrees of compressive bow or tensile bow prior to being clamped by the ESC.

In one embodiment, the electrostatic chuck comprises a chuck body coupled to a support stem, the chuck body having a top surface for supporting a substrate, and the chuck body has a volume resistivity value of about $1\times10^7$ ohm-cm to about $1\times10^{15}$ ohm-cm in a temperature of about 250° C. to about 700° C., and an electrode embedded in the body, and the electrode is coupled to a power supply.

In another embodiment, the electrostatic chuck comprises a chuck body coupled to a support stem, the chuck body having a top surface for supporting a substrate, wherein the chuck body has a volume resistivity value of about $1\times10^7$ ohm-cm to about $1\times10^{15}$ ohm-cm in a temperature of about 250° C. to about 700° C., and a heat conductivity value about 60 W/m-K and 190 W/m-K, and wherein the chuck body is composed of aluminum nitride comprising impurity elements listed in Table 1 of the present disclosure.

In yet another embodiment, the electrostatic chuck comprises an aluminum nitride body having a substrate supporting surface, wherein the aluminum nitride body has a volume resistivity value of about $1\times10^9$ ohm-cm to about $1\times10^{12}$ ohm-cm in a temperature of about 450° C. to about 650° C., wherein at least the substrate supporting surface is coated with an insulating layer.

In most embodiments, the ESC of the present disclosure is a Johnsen-Rahbek Electro Static Chuck which operates in the temperature range of about 100° C. to about 700° C. for thin film deposition applications. The operating temperature may be controlled in closed loop based upon the real time temperature measurements at any given time, or over a time period in which the operating temperature is substantially consistent, or it may change to follow a predefined course. The temperature variation across the surface of the ESC is substantially small, for example less than 10% with respect to the mean operating temperature.

In some embodiments, the ESC may incorporate one or more embedded electrode forming closed loop electrical circuitry to provide opposite charge polarity between the back side of the substrate and the top surface of the ESC, and the closed loop may include a plasma sustained between the substrate and the conductive walls that contain the ESC itself as well as other supporting parts.

In some embodiments, the ESC is composed of a bulk dielectric material of appropriate thermal, mechanical, and electrical properties to provide superior chucking performance. The bulk dielectric material may comprise primarily aluminum nitride sintered under greater than 1000° C., forming a body of the ESC of predefined geometry. The ESC body may be machined and polished comply with the predefined geometry and surface conditions. In particular to the electrical properties, the volume resistivity of the dielectric materials is controlled to fall in the range of about $1\times10^7$ ohm-cm to about $1\times10^{16}$ ohm-cm, depending upon the operating temperature. Lower level of the volume resistivity enables electrical charge migration from the embedded chucking electrode towards the top surface of the ESC so that such surface charge may induce the same amount of opposite polarity charge on the back side of the substrate. The opposite polarity charge can be sustained against discharging so as to generate continuous Coloumbic attraction force that would clamp the substrate against the ESC.

In some embodiments, the ESC may incorporate embedded heater elements forming a specific pattern, or several specific patterns occupying different zones inside the ESC body. The heater elements may be powered with one or multiple DC power supplies or powered directly using the AC lines.

In some embodiments, the ESC may incorporate a network of electrical protection circuitry against potential harm due to radio frequency and lower frequency voltage and current that may present near or coupled from elsewhere to the ESC. The protection circuitry may consist of fuses, switches, discharge paths to ground, current limiting devices, voltage limiting devices, and filtering devices to achieve sufficient attenuation of any potentially harmful voltage and current which may be distributed within one frequency exclusively, or spreaded across a broad frequency spectrum from DC, AC line frequencies, RF frequencies, up to the VHF frequencies.

In some embodiments, the top surface of the ESC may include surface contact features forming a uniform, or non-uniform pattern upon clamping. The pattern may present to the back side of the substrate as a full coverage or partial coverage of the entire area of the back side of the substrate. The contacting surface of the pattern may have micro roughness as a result of machining and polishing, and may contain a coating of substantially the same material as the ESC body, or different materials, of the appropriate thickness. The surface contact features may be in the form of distinct islands, or Mesa structures having a top surface configured to be in contact with the substrate back side, with either identical or different shapes of the islands, and distributed in either uniform density or non-uniform density across the ESC surface. The top surface may also contain blocking features whose top surface is not in contact with the substrate during processing, and may be elevated to a comparable or higher than the substrate level to prevent undesired substrate movement during wafer processing, or prior to the substrate is chucked. The blocking features may be equally spaced apart around the circumference of the ESC body, or may be extended into a continuous, ring type of structure that may be detachable to the ESC.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
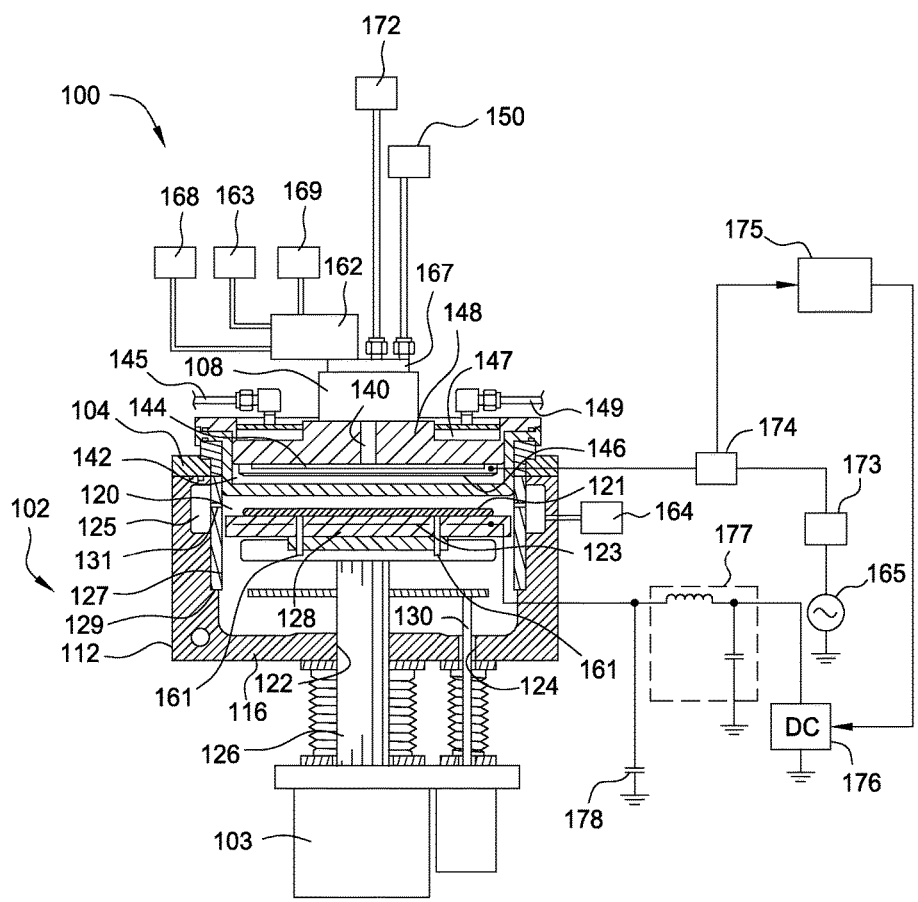
FIG. 1 illustrates a cross sectional view of a PECVD system 100 in accordance with the present disclosure.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

Exemplary Chamber Hardware

FIG. 1 illustrates a cross sectional view of a PECVD system 100 in accordance with the present disclosure. It should be noted that although a PECVD system is described in this application, apparatus and method of the present disclosure may apply to any suitable plasma process using an electrostatic chuck. The PECVD system 100 generally comprises a chamber body 102 supporting a chamber lid 104 which may be attached to the chamber body 102 by a hinge. The chamber body 102 comprises sidewalls 112 and a bottom wall 116 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of an electrostatic chuck passes through the passage 122. A rod 130 configured to activate substrate lift pins 161 passes through the passage 124.

A chamber liner 127 made of ceramic or the like is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the pumping channel 125.

The gas distribution system 108 is configured to deliver reactant and cleaning gases and is disposed through the chamber lid 104 to deliver gases into the processing region 120. The gas distribution system 108 includes a gas inlet passage 140 which delivers gas into a shower head assembly 142. The showerhead assembly 142 is comprised of an annular base plate 148 having a blocker plate 144 disposed intermediate to a faceplate 146.

A cooling channel 147 is formed in the base plate 148 of the gas distribution system 108 to cool the base plate 148 during operation. A cooling inlet 145 delivers a coolant fluid, such as water or the like, into the cooling channel 147. The coolant fluid exits the cooling channel 147 through a coolant outlet 149.

The chamber lid 104 has matching passages to deliver gases from one or more gas inlets 168, 163, 169 through a remote plasma source 162 to a gas inlet manifold 167 positioned on top of the chamber lid 104. The PECVD system 100 may comprise one or more liquid delivery sources 150 and one or more gas sources 172 configured to provide a carrier gas and/or a precursor gas.

The electrostatic chuck 128 is configured for supporting and holding a substrate being processed. In one embodiment, the electrostatic chuck 128 may comprise at least one electrode 123 to which a voltage is applied to electrostatically secure a substrate thereon. The electrode 123 is powered by a direct current (DC) power supply 176 connected to the electrode 123 via a low pass filter 177. The electrostatic chuck 128 may be monopolar, bipolar, tripolar, DC, interdigitated, zonal and the like.

In one embodiment, the electrostatic chuck 128 is movably disposed in the processing region 120 driven by a drive system 103 coupled to the stem 126. The electrostatic chuck 128 may comprise heating elements, for example resistive elements, to heat a substrate positioned thereon to a desired process temperature. Alternatively, the electrostatic chuck 128 may be heated by an outside heating element such as a lamp assembly. The drive system 103 may include linear actuators, or a motor and reduction gearing assembly, to lower or raise the electrostatic chuck 128 within the processing region 120.

An RF source 165 is coupled to the shower head assembly 142 through an impedance matching circuit 173. The faceplate 146 of the showerhead assembly 142 and the electrode 123, which may be grounded via a high pass filter, such as a capacitor 178, form a capacitive plasma generator. The RF source 165 provides RF energy to the showerhead assembly 142 to facilitate generation of a capacitive plasma between the faceplate 146 of the showerhead assembly 142 and the electrostatic chuck 128. Thus, the electrode 123 provides both a ground path for the RF source 165 and an electric bias from the DC source 176 to enable electrostatic clamping of the substrate.

The RF source 165 may comprise a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

In certain embodiments, properties of a substrate secured on the electrostatic chuck 128 may be monitored during a plasma process. In certain embodiments, flatness of a substrate secured on the electrostatic chuck 128 may be monitored during a plasma process. In one embodiment, flatness of a substrate secured on the electrostatic chuck 128 may be monitored by measuring characteristics of the electrostatic chuck 128 with the substrate secured thereon. Characteristics of the electrostatic chuck 128 may be measured by a sensor 174 connected with the faceplate 146. The sensor 174 may be a VI probe connected between the faceplate 146 and the impedance matching circuit 173. In some embodiments, the sensor 174 may be configured to measure capacitance between the faceplate 146 and the electrode 123 since capacitance between the faceplate 146 and the electrode 123 is effected by the flatness of a substrate 121 positioned between the faceplate 146 and the electrode 123. An electrostatic chuck, such as the electrostatic chuck 128, may have an increased capacitive reactance when a substrate disposed thereon becomes less flat. When a substrate is not flat, for example deformed from the heat of the plasma, there is non uniform distribution of air gap between the substrate and the electrostatic chuck 128. Therefore, variation in flatness of the substrate in an electrostatic chuck results in variation of capacitance of the plasma reactor, which may be measured by variation of imaginary impedance of the electrostatic chuck. In such a case, the sensor 174 may be configured to measure impedance of the electrostatic chuck 128 by measuring voltage and current of the capacitor formed by the faceplate 146 and the electrode 123, thereby monitoring the flatness of a substrate secured thereon.

During a plasma process, a substrate positioned on an electrostatic chuck may increase in curvature due to deformation from heating, increased thickness of deposited film, lost of chucking power, or the combination thereof. The deformation of the substrate may increase non-uniformity of the process. In one embodiment, flatness of the substrate being processed may be monitored by measuring characteristics of an electrostatic chuck that secures the substrate. Depending upon the predetermined conditions, chucking voltage of the electrostatic chuck may be adjusted to correct substrate deformation.

As shown in FIG. 1, the sensor 174 may be connected to a system controller 175. The system controller 175 may be configured to calculate and adjust the flatness of the substrate 121 being processed in the PECVD system 100. In one embodiment, the system controller 175 may calculate flatness or chucking status of the substrate 121 by monitoring characteristics, such as imaginary impedance, of the electrostatic chuck 128. When measurement of the imaginary impedance indicates that the substrate 121 decreases in flatness, the system controller 175 may increase chucking power by adjusting the DC source 176. In one embodiment, decreased flatness of the substrate 121 may be indicated by negatively increased imaginary impedance of the electrostatic chuck 128.

Exemplary Electrostatic Chuck

Figure 2:
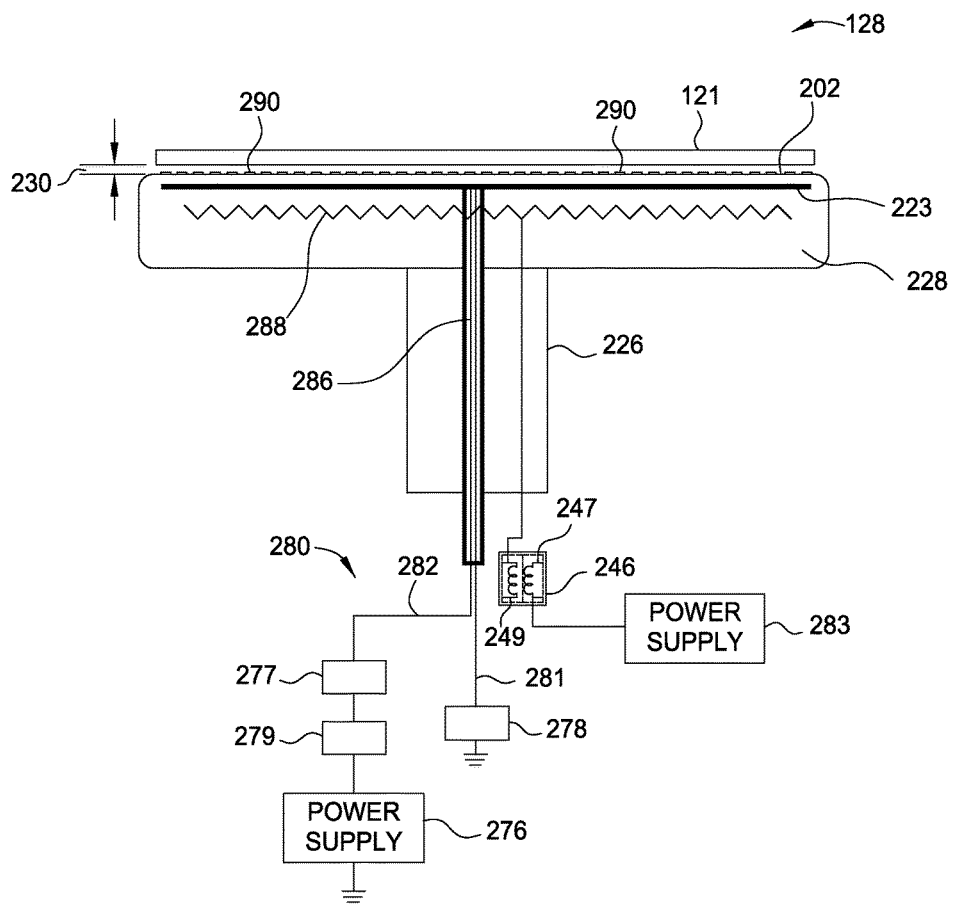
FIG. 2 is a schematic cross-sectional view of the electrostatic chuck according to various embodiments of the present disclosure.

FIG. 2 is a schematic cross-sectional view of the electrostatic chuck 128 according to various embodiments of the present disclosure. The electrostatic chuck 128 comprises a chuck body 228 coupled to a support stem 226. The body 228 has a top surface 202 configured to provide support and clamp the substrate 121 during processing. The body 228 of the electrostatic chuck 128 comprises an electrode 223 coupled to a conductive member 286. The electrode 223 may be a metal electrode of comparable size to the substrate inside the body 228, and may be built to be substantially parallel to the substrate 121 which will be held against the top surface 202 of the body 228. The electrode 223 may be arranged in any configuration or pattern such that the electrodes are evenly distributed across the top surface 202. For example, the electrode 223 may be arranged in a grid-like, a pixel-like or dot-like configuration. The conductive member 286 may be a rod, a tube, wires, or the like, and be made of a conductive material, such as molybdenum (Mo), tungsten (W), or other material with a substantially similar coefficient of expansion with other materials comprising the body 228.

In one embodiment, the electrostatic chuck uses a single piece of the electrode 223 to maintain substantially uniform voltage between the electrode 223 and the substrate 121. Alternatively, the electrostatic chuck may use bipolar ESC where multiple chucking electrodes with different voltages are used to generate the clamping force. In some embodiments the electrostatic chuck 128 may have a biasing electrode embedded or disposed in the body 228 to provide an electrical bias to the substrate to promote or enhance the electrostatic clamping of the substrate. Alternatively, the electrode 223 may provide both a ground path for a radio frequency (RF) power (e.g., the RF source 165 in FIG. 1) and an electric bias to the substrate 121 to enable electrostatic clamping of a substrate.

In order to provide an electrical bias to the substrate 121, the electrode 223 may be in electronic communication with a power supply system 280 that supplies a biasing voltage to the electrode 223. The power supply system 280 includes a power supply 276 that may be a direct current (DC) power source to supply a DC signal to the electrode 223. In one embodiment, the power supply 276 is a 24 volt DC power supply and the electrical signal may provide a positive or negative bias. The power supply 276 may be coupled to an amplifier 279 to amplify the electrical signal from the power supply 276. The amplified electrical signal travels to the conductive member 286 by a connector 282, and may travel through a network of electrical circuitry 277 to filter the amplified signal to remove noise and/or remove any RF current from the biasing voltage from the power supply system 280. The amplified and filtered electrical signal is provided to the electrode 223 and the substrate 121 to enable electrostatic clamping of the substrate 121. The electrode 223 may also function as an RF ground, wherein RF power is coupled to ground by a connector 281. A capacitor 278 may be coupled to the ground path to prevent the biasing voltage from going to ground. In this manner, the electrode 223 functions as a substrate biasing electrode and an RF return electrode.

In some embodiments, the substrate 121 may be in partial contact with the top surface 202 of the body 228, forming a contact gap 230 which is capacitor in nature. The chucking voltage is applied to the contact gap 230 which effectively generates the needed chucking force. In operation, the power supply 276 serves as a source of electric charge, and from the electrode 223 the stored charge can migrate to the top surface 202 of the body 228 through the bulk material (of the body 228) of finite electrical conductivity. The surface charge then induces an equal amount, but of the opposite polarity charge on the bottom of the substrate 121 where the Columbic attraction forces between the opposite charges will effectively hold the substrate 121 against the top surface 202. Some of the induced surface charges on the bottom of the substrate 121 may be come from a contact connection between the top surface 202 of the substrate 121 and the other end of the power supply 276, through a common ground connection that is the conductive chamber wall. Such a connection may be formed by striking and sustaining plasma between the substrate 121 and the chamber sidewalls (e.g., sidewalls 112 shown in FIG. 1) which behave as a conductive media to close the electric current loop to supply the chucking voltage and charges to the contact gap 230. Releasing the substrate from the electrostatic chuck is achieved by removing the chucking voltage supplied to the electrode 223, together with the charges contained in the body 228, and in the meantime the plasma is kept running until the charges on the substrate 121 is drained.

With respect to the surface charge built up at the top surface 202 of the body 228, it is a direct result of the charge migration due to finite conductivity of the semiconducting materials. It brings closer the charges of the opposite polarity, effectively reducing the contact gap. It is recognized that the electrostatic chucking force is proportional to the square of the contact gap voltage, and is inversely proportional to the square of the contact gap height. It is therefore expected that the charge migration helps to increase the chucking force at a given chucking voltage, for an ESC design which would otherwise be equivalent. In other words, materials of higher conductivity (such as AlN to be described below) may exhibit higher chucking force compared to that at lower conductivity. This phenomenon of charge migration is often referred to as the Johnsen and Rahbek (J-R) effect. In the temperature regime specific to the present disclosure, the AlN dielectric materials exhibit high conductivity, or low resistivity, placing the disclosed high temperature ESC implementation into a category of J-R effect chuck. Contrary to the J-R category is the Columbic effect chuck where the dielectric materials are much less conductive, or even not conductive, requiring a higher chucking voltage to reach the equivalent chucking force.

It is contemplated that the geometry, gap height, effective contact area, surface roughness, and the resistivity of the material (e.g., AlN) and the substrate all play important role in determining amount of charge and its distribution upon the contact capacitor such that a significant portion of the ESC voltage will be applied to the contact gap 230 which effectively generates the needed chucking force. A sufficient chucking force may be one that can clamp the substrate in minimal or less than a few seconds of time, and sustain the clamping force during the substrate processing. In most cases, a sufficient chucking force is about $1 \times 10^{-2}$ Torr to $1 \times 10^2$ Torr. Time constant of charging and discharging the contact gap capacitor also determines the time to completely chucking the substrate, and subsequent release from the electrostatic chuck. ESC power supply current is needed to maintain a constant chucking voltage during the entire substrate processing, or at specific steps of the processing recipe as needed. In most cases, the waveform of the contact gap voltage may advantageously include minimal rise and fall time, with a substantially flat portion in between where its value approaches a significant portion of the applied ESC supply voltage. This type of waveform may not be satisfied across a wide range of the operating temperature (e.g., −20° C. to about 850° C.) if one use the same grade of materials. This is due to the temperature dependent nature of the dielectric materials to be used in the body 228. As will be discussed in more detail below with respect to FIG. 3, the volume resistivity of a certain grade of the AlN materials under a specific manufacturing process may vary by several orders of magnitude from the room temperature up to 750° C. Therefore, optimization of the body 228 is necessary to select the appropriate grade materials having certain characteristics for a specific operating temperature regime, e.g., in high temperature applications.

In various embodiments of this disclosure, the body 228 comprises, or is composed of a ceramic material capable of providing sufficient chucking force to the substrate in a temperature range of about −20° C. to about 850° C., such as about 350° C. to about 700° C., for example about 650° C. Particularly, the body 228 provides one or more of following characteristics in general: (1) relatively high mechanical strength and rigidity to withstand stress caused by the difference in thermal expansion during high temperature process; (2) high purity (≥99 atm %) and volume resistivity value of about $1 \times 10^6$ ohm-cm to about $1 \times 10^{17}$ ohm-cm to ensure low leak current in the body 228 at high temperatures; and (3) heat conductivity value about 60 W/m-K to offer excellent conductivity. In some embodiments, the body 228 may have a relative dielectric constant of 8 to 10. Suitable ceramic materials may include, but are not limited to aluminum nitride (AlN), aluminum oxide ($Al_2O_3$), silicon dioxide ($SiO_2$), or other ceramic materials. In most embodiments, the body 228 is composed of AlN. In one embodiment, the body 228 is composed of a specific grade AlN containing one or more impurity elements, such as Si, Fe, Ca, Mg, K, Na, Cr, Mn, Ni, Cu, Zn, and Y, to satisfy the above characteristics (1)-(3). The amount of AlN contained in the specific grade AlN is generally above 99 wt %. In some embodiments, the body 228 is composed of the specific grade AlN containing at least Si, Fe, Ca, and Y. In various examples, the content of Si may be between about 3 ppm and about 48 ppm, such as between about 3 ppm and about 8 ppm, between about 8 ppm and about 13 ppm, between about 13 ppm and about 18 ppm, between about 18 ppm and about 23 ppm, between about 23 ppm and about 28 ppm, between about 28 ppm and about 33 ppm, between about 33 ppm and about 38 ppm, between about 38 ppm and about 43 ppm, between about 43 ppm and about 48 ppm. In one example, the content of Si is about 7 ppm to about 39 ppm. The content of Fe may be between about 2 ppm and about 16 ppm, such as between about 2 ppm and about 4 ppm, between about 4 ppm and about 6 ppm, between about 6 ppm and about 8 ppm, between about 8 ppm and about 10 ppm, between about 10 ppm and about 12 ppm, between about 12 ppm and about 14 ppm, between about 14 ppm and about 16 ppm. In one example, the content of Fe is about 4 ppm to about 10 ppm. The content of Ca may be between about 5 and about 225, such as between about 5 ppm and about 25 ppm, between about 25 ppm and about 45 ppm, between about 45 ppm and about 65 ppm, between about 65 ppm and about 85 ppm, between about 85 ppm and about 105 ppm, between about 105 ppm and about 125 ppm, between about 125 ppm and about 145 ppm, between about 145 ppm and about 165 ppm, between about 165 ppm and about 185 ppm, between about 185 ppm and about 205 ppm, between about 205 ppm and about 225 ppm. In most examples, the content of Ca is about 10 ppm to about 180 ppm. In one example, the content of Ca is about 15 ppm. In another example, the content of Ca is about 170 ppm. The content of Y may be about 0.01 ppm and about 805 ppm, such as between about 0.01 ppm and about 85 ppm, between about 85 ppm and about 165 ppm, between about 165 ppm and about 245 ppm, between about 245 ppm and about 325 ppm, between about 325 ppm and about 405 ppm, between about 405 ppm and about 485 ppm, between about 485 ppm and about 565 ppm, between about 565 ppm and about 645 ppm, between about 645 ppm and about 725 ppm, between about 725 ppm and about 805 ppm. In one example, the content of Y is less than about 1 ppm. In some examples, the content of Y may be about 1 wt % to about 9 wt %, for example 1 wt % to about 3 wt %, about 3 wt % to about 6 wt %, about 6 wt % to about 9 wt %. In one example, the content of Y is about 3.3 wt %.

In some embodiments, the body 228 may further contain Na and Cr. In such a case, the content of Na may be about 0.01 ppm to about 5.4 ppm, such as between about 0.01 ppm and about 0.9 ppm, between about 0.9 ppm and about 1.8 ppm, between about 1.8 ppm and about 2.7 ppm, between about 2.7 ppm and about 3.6 ppm, between about 3.6 ppm and about 4.5 ppm, between about 4.5 ppm and about 5.4 ppm. In one example, the content of Na is about 2 ppm. In another example, the content of Na is less than about 1 ppm. The content of Cr may be about 0.01 ppm and about 3 ppm, such as between about 0.01 ppm and about 0.6 ppm, between about 0.6 ppm and about 1.2 ppm, between about 1.2 ppm and about 1.8 ppm, between about 1.8 ppm and about 2.4 ppm, between about 2.4 ppm and about 3 ppm. In one example, the content of Cr is about 1 ppm. The body 228 may contain additional impurity elements such as Mg, K, Mn, Ni, Cu and Zn. In such a case, the content of each additional impurity element may be less than about 1 ppm.

The body 228 composed of the material and impurity element contents described herein is expected to provide following mechanical properties: (1) purity equals or above about 99 atm %; (2) bulk density of between about 3.15 g/cc and about 3.45 g/cc, for example about 3.33 g/cc; (3) thermal conductivity of between about 60 W/m-K and 190 W/m-K, for example about 170 W/m-K; (4) liner thermal expansion coefficient (1000° C.) of between about $5.2 \times 10^{-6}$/° C. and about $5.9 \times 10^{-6}$/° C., for example about $5.7 \times 10^{-6}$/° C.; (5) flexural strength of between about 250 MPa and about 500 MPa, for example about 400 MPa; (6) Young's Modulus of between about 250 GPa and about 350 GPa, for example about 300 GPa; and (7) Vickers Hardness between about 900 Hv and about 1300 Hv, for example about 987 Hv.

Compositions of exemplary specific grade AlN that can be used for the body 228 are listed in Table 1 below.

TABLE 1

| | Material | | | | |
|---|---|---|---|---|---|
| Element | Material 1 ppm | Material 2 ppm | Material 3 ppm | Material 4 ppm | Material 5 ppm |
| Si | 40 | 18 | 12 | 16 | 8 |
| Fe | 12 | 6 | 4 | 12 | 4 |
| Ca | 172 | 160 | 86 | 196 | 16 |
| Mg | <1 | <1 | <1 | <1 | 0.6 wt % |
| K | <1 | 1 | 2 | <1 | <1 |
| Na | 2 | <1 | 3 | <1 | <1 |
| Cr | 1 | <1 | <1 | 1 | 1 |
| Mn | <1 | <1 | <1 | <1 | <1 |
| Ni | <1 | <1 | <1 | <1 | <1 |
| Cu | <1 | 1 | <1 | <1 | <1 |
| Zn | <1 | <1 | <1 | <1 | <1 |
| Y | 3.6 wt % | 12 | 740 | 60 | <1 |

Figure 3:
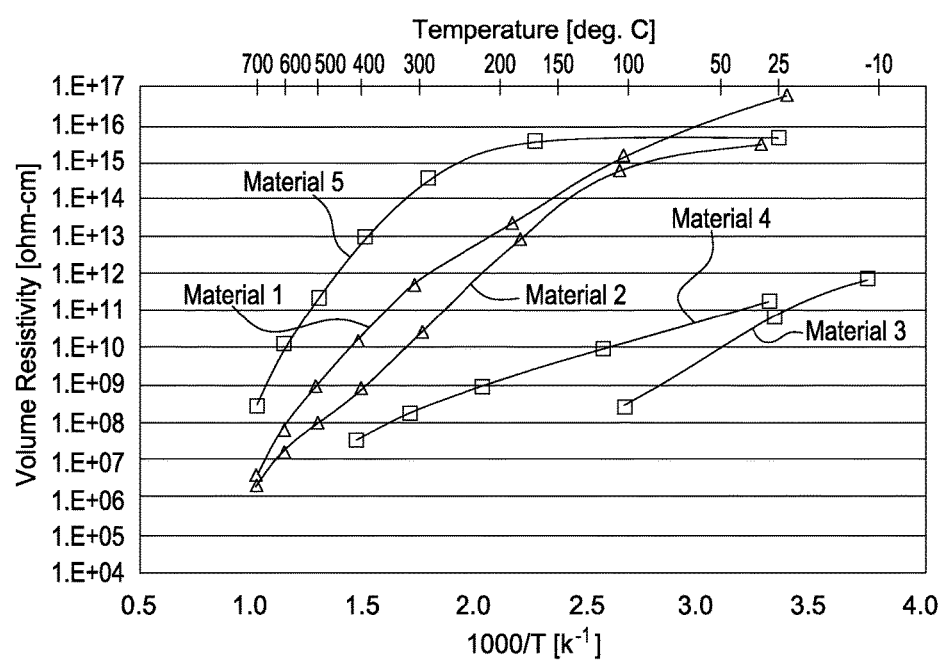
FIG. 3 is a graph illustrating the relationship between temperature and volume resistivity values of a body composed of Materials 1-5 under a specific manufacturing process.

FIG. 3 is a graph illustrating the relationship between temperature and the volume resistivity values of a body 228 composed of Materials 1-5 under a specific manufacturing process. As can be seen, the volume resistivity values of Materials 1-5 vary in the range of $1 \times 10^6$ ohm-cm to about $1 \times 10^{17}$ ohm-cm by several orders of magnitude from $-10°$ C. to up to about 700° C. Specifically, FIG. 3 shows that the volume resistivity of Materials 1-5 goes down almost exponentially when operating temperature increases linearly. It has been observed that the leak current at the time of voltage application would be too small to obtain sufficient chucking force (e.g., $1 \times 10^{-3}$ Torr to $1 \times 10^3$ Torr) if a volume resistivity value of the ESC material is more than $1 \times 10^{16}$ ohm-cm, whereas the leak current would become excessive and cause breakdown of the circuits on the substrate chucked if a volume resistivity value of the ESC material is less than $1 \times 10^6$ ohm-cm. It is therefore advantageous to make the volume resistivity value of the body 228 to be in the range of $1 \times 10^6$ ohm-cm to about $1 \times 10^{16}$ ohm-cm to provide sufficient chucking force. When electrostatic chucks were composed of Materials 1-5 and tested, it was observed that Materials 1-5 generated chucking forces at a wide temperature range between about $-5°$ C. and about 700° C. Particularly, the body 228 composed of Material 1 and Material 5, which has a volume resistivity value of about $1 \times 10^7$ ohm-cm to about $1 \times 10^{18}$ ohm-cm (about 250° C. to about 650° C.) and about $1 \times 10^8$ ohm-cm to about $1 \times 10^{18}$ ohm-cm (about 250° C. to about 700° C.), respectively, are capable of providing sufficient chucking force (e.g., $1 \times 10^{-3}$ Torr to $1 \times 10^2$ Torr) at high temperature range of about 250° C. to about 700° C. It has also been recognized by present inventors through the development process that electrostatic chucks composed of Materials 1 and 5 having a thermal conductivity value of 170 W/m-K helps to achieve 5° C. temperature range or variation at 650° C. operating temperature. While only the electrostatic chucks composed of Materials 1-5 are illustrated, electrostatic chucks composed of other materials as described in various embodiments of this disclosure can also be used to provide effective chucking force at a wide temperature range of about 25° C. to about 700° C., particularly higher temperatures of about 200° C. to about 650° C., in the PECVD semiconductor manufacturing process or other similar semiconductor manufacturing process.

Referring back to FIG. 2, in some embodiments the body 228 may include one or more embedded heaters 288 to provide heat to the body 228. The heat from the heater 288 is then transferred to the substrate 121 to enhance a fabrication process, such as a deposition process. The heater 288 may or may not be positioned in parallel to the electrode 223. Although the heater 288 is shown in a position below the electrode 223, the electrode may be disposed along the same plane as, or above the heater 288. The heater 288 may be a single continuous metal line or may be in the form of discrete metal lines. The heater 288 may be any heating device that is suitable for providing inductive or resistive heating to the electrostatic chuck. A temperature sensor (not shown), such as a thermal couple, may be embedded in the body 228. The temperature sensor may be connected to a temperature controller (not shown) which provides control signal to a power supply 283 to control the temperature of the body 228.

The heater 288 is coupled to the power supply 283 through the support stem 226 to supply power to the heater 288. The power supply 283 may include a direct current (DC) power source, an alternating current (AC) power source, or a combination of both. In one embodiment, the power supply 283 is an alternating current (AC) power source to provide AC signal to the heater 288. The heater 288 may be composed of a resistive metal, a resistive metal alloy, or a combination of the two. Suitable materials for the heating elements may include those with high thermal resistance, such as tungsten (W), molybdenum (Mo), titanium (Ti), or the like. The heater 288 may also be fabricated with a material having thermal properties, e.g., coefficient of thermal expansion, substantially similar to that of the material comprising the body 228 to reduce stress caused by mismatched thermal expansion.

The heater 288 may be arranged in any predetermined patterns to control the operating temperature as well as its uniformity across the top surface 202 of the body 228 and the substrate 121. For example, the heater 288 may be arranged to provide a single heating zone or multiple independently, azimuthally controllable heating zones across the top surface 202 of the body 228. The position and layout of the heater 288 directly affect the operating temperature and the temperature distribution, or the temperature profile across the chuck surface. Such temperature profile may be substantially consistent over a period of time, or may be changed to a different yet effective one by dynamically adjusting the power to each of the heater elements. Closed loop temperature control based on in situ temperature sensors embedded inside the body 228 may be used to maintain accurate operating temperature and the temperature gradient across the body 228 and the substrate surface. It is contemplated that different heater zone configuration such as one, two, three, four or more zone heaters combined with the chucking function is possible depending upon the process requirement. The position and layout of the heater 228 as well as the operating temperature during the film deposition can be manipulated by an ordinary skill in the art to control thickness, uniformity, stress, dielectric constant, or refractive indexes, etc. of a film.

In some embodiments, the network of electrical circuitry 277 may be configured to protect the power supplies for the ESC and for the heater 288 against AC and reactive RF voltage and current which may couple to the chucking electrode and the heater 288 through the ESC dielectric materials. Such coupling could be detrimental to the DC power supplies or AC power sources which are not designed to handle the respective AC and RF load. To protect the ESC power supply and the AC power lines for heaters, the network of electrical circuitry may include RF filters circuitry with high input impedance to minimize or prevent the RF voltage and current from going into the load it protects. The RF filters circuit may depend on the operating frequency. For example, at 13.56 MHz, a simple LC parallel resonant circuit presents to the high voltage side as a high impedance circuit and thus may act as an open circuit for the RF frequency but act as pass through for other frequencies and for DC. In case where multiple RF frequencies are involved, multiple filter stages can be used to satisfy a minimum RF impedance requirement at each of the operating frequency.

There may be specific filter requirement related to ESC operating near the high end of the temperature regime (e.g., 700° C.). As discussed previously, the resistivity of the AlN materials becomes much lower than at high temperature, which may result in increased coupling between the embedded chucking electrode 223 and the heaters 288 since they are physically close by. Therefore, lower frequency signals that exhibit primarily in the AC line side of the heater circuitry may couple through the AlN dielectric chucking materials to the chucking electrode and affect the chucking voltage. Example of the lower frequency signals are the line frequency at 50 Hz or 60 Hz. In some cases, a significant portion of the line voltage may couple to the chucking electrode. In such a case, the DC ESC supply will act as a load to the noise which may not be desirable since most of the DC power supplies commercially available are not designed to take AC load. Since AC coupling problem may be severe at higher temperatures where the resistivity of the AlN materials is much lower, in some embodiments additional AC line filters, such as an EMI filter designed for 50 Hz or 60 Hz AC line frequencies, may be used to reduce low frequency noise coupling to the chucking electrode and protect the ESC supply.

In some cases, implementation of multiple RF frequency and lower frequency filters may be necessary whether they are in series, in parallel, or in any combination format, on each circuit branch as needed. In some embodiments, a single 13.56 MHz high impedance filter in series with a 27 MHz high impedance filter may be inserted between each of the connection line made to the embedded heater 288, whereas one additional low frequency EMI filter in series with the RF filters may be inserted between the embedded ESC electrode 223 and the ESC power supply 276. Various filter topologies, such as input impedance values, bandwidth, cut-off frequencies, frequency response curves, and the degree of attenuation, etc., in any or all appropriate combinations, may be controlled depending upon the application. The network of electrical circuitry 277 may be disposed at any appropriate locations with respect to the electrostatic chuck, regardless of whether inside, or outside of a chamber environment, close by, or remotely where they are further apart from the sources which they are designed to protect. It is further recognized that the filter requirement and implementation depends highly upon the system requirement, and may not be limited to the above described examples, although without exception, should be considered derivations based on the currently disclosed method and implementation.

Although some embodiments of the disclosure describe an implementation of the ESC where the heater is not actively driven by RF power of any frequencies, it is contemplated that such RF drive scenarios may be a derivative of the present disclosure because the very principle of chucking under the described high temperature remains the same whether there is active RF power driven from the heater side of the chamber. All aspects related to the ESC such as ceramic materials selection and RF filter design remain the same regardless of whether there is or there is no RF drive from the heater side of the chamber (i.e., ESC with or without active RF drive from the mesh side), or regardless of what RF voltage and current is running on the RF mesh while a DC chucking voltage is applied simultaneously to the same mesh electrode. It is recognized that in case of the level of the RF voltage and current which present on the chucking electrode, either the RF voltage or current, or both, may be different or higher than those when the RF drive come from the top electrode instead of the bottom and heater side. As such the requirements to the previously described protection circuitry may change accordingly in order to reach the same level of isolation. Namely, the input impedance for the particular operating frequency or frequencies may be higher in order to achieve the same level of the leakage RF voltage or current which correspond to those from top driven RF electrodes.

It has been observed that ESC chucking leakage current path may be established through the heater 288 to ground, and/or through the substrate/surface of body 228 to the plasma and to ground. When all, or a significant part of the ESC current goes through the substrate to ground, it may potentially exceed a threshold to which it would induce electrical damage to the device structures resided on the substrate. Such electrical damage may include charging damage and or insulation layer breaking down. One approach to optimize the ESC current under high operating temperature is to use the dielectric materials of higher resistivity. As discussed previously with respect to FIG. 3 containing electrical properties of a collection of Materials 1-5 for making the body 228, Material 5 appears to have a volume resistivity of $1\times10^{10}$ ohm-cm at about 600° C., as compared to that of Material 1, at $1\times10^{8}$ ohm-cm, and therefore Material 5 will exhibit lower ESC current than Material 1. In case the total ESC current may go to ground directly, through the bulk AlN material, and then to the heater 288, without going through the plasma return path, this portion of the ESC current will reduce at higher AlN resistivity, as well as the portion which goes through the plasma to ground.

Another approach of reducing the ESC chucking leakage current going to ground through the heater 288 is to float the heater 288 with respect to ground potential. This method is believed to eliminate the portion of the ground current completely, regardless of the resistivity of the bulk dielectric materials for the body 228. An example of implementing such DC isolation is to power the heater 288 by AC lines of 50 Hz or 60 Hz, through an isolation transformer 246 disposed between the heaters 288 and the power supply 283. The isolation transformer 246 is used to cut off ground current path. In such a case, the isolation transformer 246 may include a primary coil windings 247 and a secondary coil windings 249. The primary coil windings 247 may be connected to the power supply 283 while the secondary coil windings 249 may be connected to the electrical load sought to be protected (i.e., the heater 288). Therefore, the heater 288 can be electrically isolated from the AC voltage source and any transients from the external source to reduce the leakage current. In most cases, the isolation transformer 246 should be designed to stand for the maximum ESC voltage without breaking down, while allowing no DC current across its primary and secondary coil windings. In the meantime however, the AC current may pass freely between the primary and the secondary coil windings of the isolation transformer 246. Depending upon the configuration of the heater 288, the isolation transformer 246 could be a single-zone or multi-zone isolated transformer. In cases where the electrostatic chuck including multiple heating zones, multiple transformers or a single transformer with multiple primary and, or secondary coil windings may be used to maintain DC isolation between the heaters to ground.

Yet another approach of reducing the ESC chucking leakage current is to provide a layer of high resistivity or insulating materials on the top surface 202 of the body 208 which would cut off or significantly reduce the DC current leaking through the plasma to chamber ground. Such insulating layer needs to exhibit much higher resistivity compared to the bulk dielectric materials of the body 208 at the operating temperature, with good adhesion to the bulk dielectric materials under the operating temperature as well as withstanding any possible thermal cycles, and needs to be free of voids or pinholes which may become a DC current path to ground. Such insulating layer may need to sustain the same or sufficient isolation conditions when subjected to the maximum DC chucking voltage with or without any possible superposition with voltages in higher frequencies, namely, the AC line voltage and RF voltages of a single or multiple RF frequencies. Such isolation layer may be manufactured into the ESC permanently through qualified coating process, or may be generated in situ prior to the deposition process starts, either once or repeatedly, inside of the chamber environment. In case of in situ layer of DC insulation, the thickness, area of coverage, and film composition may be controlled to achieve sufficient isolation over a sufficient period of time, if such layer may ware or deteriorate over time.

The insulating layer may be fabricated from an insulating material, such as a dielectric material or a ceramic material. Suitable examples of the ceramic materials or dielectric materials may include silicon oxide, such as quartz or glass, aluminum oxide ($Al_2O_3$), aluminum nitride (AlN), silicon nitride (SiN), yttrium containing materials, yttrium oxide ($Y_2O_3$), yttrium-aluminum-garnet (YAG), titanium oxide (TiO), titanium nitride (TiN), silicon carbide (SiC), ASMY (aluminum oxide silicon magnesium yttrium), high performance material (HPM) composing of a compound of $Y_4Al_2O_9$ (YAM) and a solid solution of $Y_{2-x}Zr_xO_3$ ($Y_2O_3$—$ZrO_2$ solid solution), magnesium oxide (MgO), zirconia ($ZrO_2$), titanium carbide (TiC), boron carbide ($B_xC_y$), boron nitride (BN), and other similar or different properties which can satisfy the same isolation requirement. A doped ceramic, such as titania doped alumina or calcium doped aluminum nitride or the like may also be used.

Figure 4A:
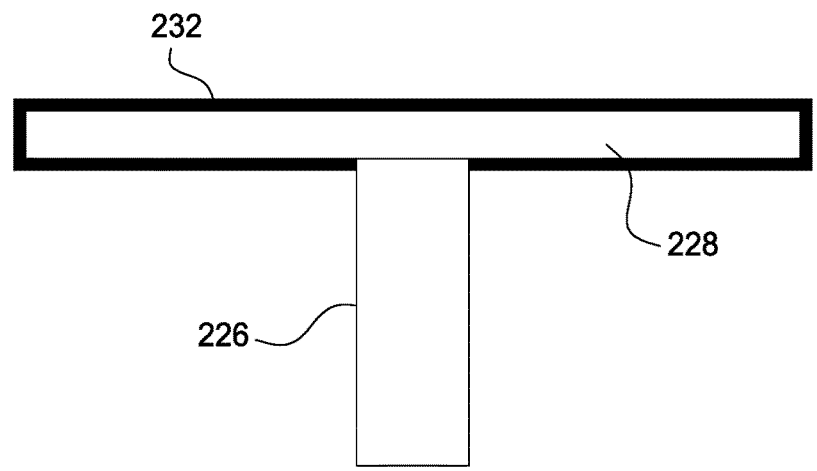
FIGS. 4A to 4D illustrate schematic cross-sectional views of an electrostatic chuck having different arrangements of an insulating layer according to embodiments of the disclosure.
Figure 4B:
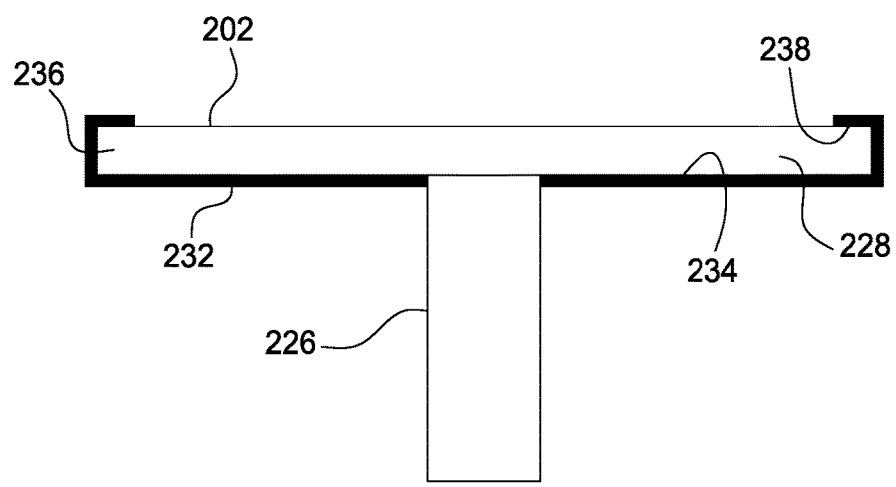
Figure 4C:
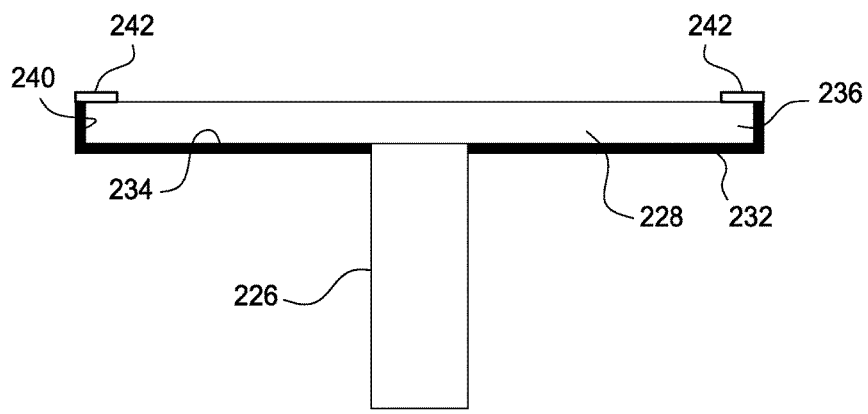
Figure 4D:
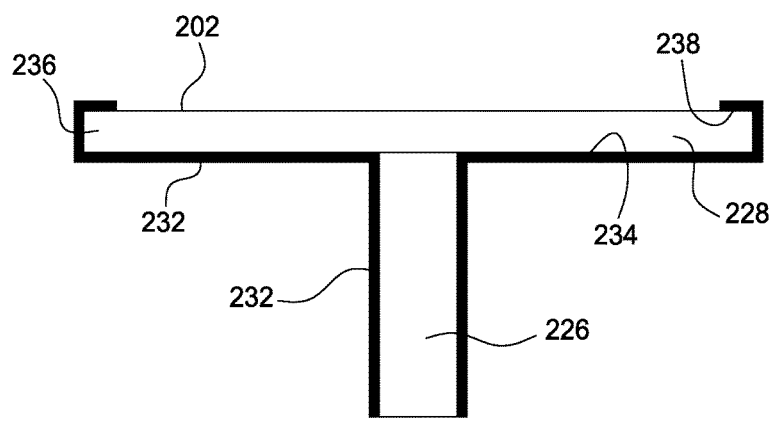

FIGS. 4A to 4D illustrate schematic cross-sectional views of the electrostatic chuck 128 having different arrangements of the insulating layer 232 according to embodiments of the disclosure. FIG. 4A shows the insulating layer 232 is coated on the exterior surface of the entire body 228. FIG. 4B shows the insulating layer 232 is coated on the entire bottom surface 234 of the body 228. In one example, the insulating layer 232 may be extended upwardly from the bottom surface 234 to cover the shoulder 236 and the peripheral edge 238 of the body 228. The peripheral edge 238 may cover about 2% to about 15% of the surface area of the top surface 202. FIG. 4C shows the insulating layer 232 is coated on the entire bottom surface 234 and the side 240 of the body 228. In one example, the peripheral edge 238 of the body 228 may be covered by a dielectric ring 242. In some embodiments, the exposed surface of the support stem 226 of FIGS. 4A and 4C may be optionally coated with the insulating layer 232. FIG. 4D shows the insulating layer 232 is coated on the entire bottom surface 234 of the body 228 and exposed surface of the support stem 226. In one example, the insulating layer 232 may be extended upwardly from the bottom surface 234 to cover the shoulder 236 and the peripheral edge 238 of the body 228. The dielectric ring 242 may be made of the same material as the insulating layer 232 as discussed above.

In some embodiments, the top surface 202 of the body 228 may have various patterns of surface contacts 290 which may be arranged close to and/or in contact with the back side area of the substrate 121 to affect chucking force and timing performance. The surface contacts 290 on the top surface 202 may make a dense contact at about 45% to about 70% (high contact area), such as about 65%, about 15% to about 45% (intermediate contact area), such as about 30%, and about 0.01% to about 15% (low contact area), such as about 0.3%, with the back side area for a 300 mm diameter substrate. Various parameters, such as bulk pedestal materials properties, surface contact area, any specific pattern of contact which contains the identical or non-identical contact islands, often referred to as Mesa islands, the shape and height of each of the Mesa island, and their collective distribution across the ESC surface, in either uniform or non-uniform number density with respect to part or all of the ESC surface, and the roughness Ra of the top contact surface finish, etc., may be optimized to achieve a desirable chucking force for any given or all of the applications. An ESC contact surface optimization process may yield an ESC design for one application requirement, or designs for a broad range of application requirements, depending upon the operating temperature, ESC voltage, ESC current, and the time to chuck or release. For example, one optimization process may target at minimum chucking voltage using maximum contact area, while another one may include minimizing the DC chucking current on the ESC power supply. The requirement of lowering chucking current may be advantageous from the power supply packaging point of view, as it would require a small form factor power ESC supply that can be easily integrated into the ESC assembly. Additional advantage of maintaining low chucking current is to minimize excessive DC power imposed upon the ESC bulk materials so as to reduce excessive resistive heating during chucking, in case the DC resistive heating related to chucking is not considered as a factor affecting the overall temperature distribution on the high temperature ESC surface. In other words, the mean and distribution of the ESC surface temperature may change, with or without the applied DC chucking power, leading to a drift in substrate temperature.

Figure 5:
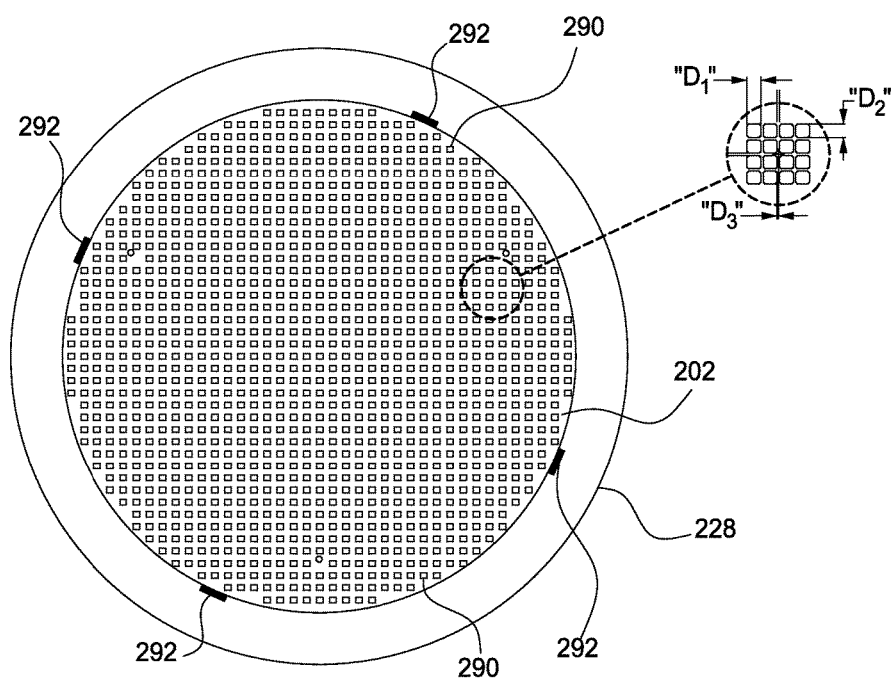
FIG. 5 shows exemplary arrangements of surface contacts according to embodiments of the disclosure.

FIG. 5 shows an exemplary arrangement of the surface contacts 290 according to embodiments of the disclosure. The surface contacts 290 may be arranged in a dot-like configuration as shown to allow a substantially uniform pressure across the back side of the substrate and also a substantially uniform distribution of chucking force between the surface contacts 290 and the substrate 191. Alternatively, the surface contacts 290 may be arranged in other suitable configurations such as a grid-like, a pixel-like configuration, a multiple rings of concentric configuration, or any combination thereof (including the dot-like configuration). The surface contacts 290 may also be arranged in a rectangular array, a hexagonal array, or a honeycomb array. The surface contacts 290 may be arranged in a symmetrical or asymmetrical manner, depending upon the process regime. In one embodiment, the surface contacts 290 are square-shaped islands with specified surface roughness. The surface contacts 290 take up about 15% to about 45%, for example about 30%, of the surface area of the substrate supporting surface, i.e., top surface 202 of the body 228. The surface contacts 290 therefore make contact with about 15% to about 45%, for example about 30%, of the substrate back side area in a uniform fashion. In one some examples, the surface contacts 290 makes a dense contact at about 50% to about 85%, for example about 65%, of the substrate back side area in a uniform fashion. In some examples, the surface contacts 290 makes a sparse contact at about 0.1% to about 30%, for example about 0.3%, of the substrate back side area.

It is contemplated that the surface contacts 290 may be bumps or projections of any suitable shape such as rectangular, rhombus, square, hemispherical, hexagonal, triangular protrusions or mixtures of differently shaped protrusions. In most cases, the surface contacts 290 may each have a height of about 0.1 mm to about 1 mm, for example about 0.5 mm, and a length "$D_1$" of about 0.05 mm to about 5 mm, for example about 1.5 mm to about 3.5 mm, and a width "$D_2$" of about 0.05 mm to about 5 mm, for example about 1.5 mm to about 3.5 mm. The distance "$D_3$" between two neighboring surface contacts 290 may be about 0.1 mm to about 0.6 mm, for example about 0.5 mm. As the total chucking force is proportional to the effective contact area for a give clamping pressure, consideration to the thermal properties of the high temperature ESC should be also taken in order to achieve required temperature uniformity specification.

In some embodiments, the body 228 may include gas inlets, gas channels and the like located across the top surface 202 or towards the periphery of the body 228 to distribute cooling gas, such as helium, to the back side of the substrate. The size, location, and pattern of the gas inlets/channels distributes gas in the contact gap 230, minimizes pressure gradients, and facilitates the transfer of heat from the substrate 121 to the body 228. The gas pressure provided by the gas inlets/channels may be between about 1 Torr and about 20 Torr, or a pressure that is low enough so that the clamping force holding the substrate is not seriously diminished.

In some embodiments, the body 228 may include a group of erected objects or tabs 292 located outside of the substrate edge to contain the substrate within the objects or tabs 292 in case there is substrate movement prior to chucking. Such substrate movement with respect to the ESC surface may be possible due to thermal shock, or an instant thermal expansion of the substrate upon contact with the ESC surface at a different, or much higher temperature. An instant and partial mechanical expansion of the substrate dimension may lead to substantial substrate deformation, resulting in substrate displacement with respect to the ESC pedestal. Such a substrate displacement is undesirable if the substrate remains displaced during the deposition process as it would lead to inconsistent process results, or to the worst case substrate breakage. The number of the objects or tabs 292 may be between about 3 and 6, or example about 4, although more or less number of objects or tabs 292 is contemplated.

The objects or tabs 292 may be equally spaced apart around the circumference of the body 228.

As discussed above, the substrate may move with respect to the ESC surface (i.e., top surface 202) due to thermal shock or thermal expansion of the substrate upon contact with the ESC surface at higher temperatures. It has been observed by the present inventors that pre-heating the substrate to a temperature that is the same or substantially close to the ESC surface temperature can minimize the thermal shock. In one embodiment, a method of preheating the substrate may include heating the process chamber prior to transferring the substrate into the process chamber, or prior to the deposition process. The process chamber may be heated by an in situ pre-heating process using plasmas bombardments as the source of heat transfer. One example of implementing in situ pre-heating process is to introduce an inert gas into the process chamber and form a plasma from the inert gas using low RF power. The pressure of the process chamber may be maintained between about 1 Torr to about 15 Torr, for example about 2 Torr to about 10 Torr. The pre-heating process may be performed for about 1 second to about 180 seconds. Thereafter, the chucking voltage is applied to the electrode of the electrostatic chuck and a PECVD process may be performed. The RF power level of between about 0.5 Watts and about 950 Watts, may be used to ignite and sustain a low density plasma of inert gas. Suitable inert gas may include He, Ar, Xe, Ne, Kr, $N_2$, or mixtures thereof. The inert gas may be flowed at a flow rate of about 100 sccm to about 8000 sccm, for example about 250 sccm to about 6000 sccm. In one embodiment, the pre-heating process uses a low density helium plasma to heat the process chamber. It has been observed that a non-planar substrate, such as a convex or concave substrate, can be securely chucked and become flat within 2 or 3 seconds if the pre-heating process is conducted before the PECVD process. As the center and edge of the substrate are both chucked, the substrate is flattened and is in more uniform communication with the electrostatic chuck, which increases global thickness uniformity of deposited materials. It is contemplated that the gas species, RF power, and pre-heat time may be optimized so that the substrate temperature after the pre-heating process reaches that of the ESC surface temperature or with a neglectable temperature difference to eliminate or minimize the thermal shock.

Alternatively, a separate pre-heating chamber in which appropriate heating methods through contact heat transfer or radiation heat transfer may be employed to pre-heat the substrate to the ESC operating temperature and result in the same effect. Such pre-heating chamber may be the existing load-lock chamber for substrate transfer whereas a heating mechanism is implemented.

It should be appreciated that ESC operating parameters such as temperature, ESC voltage, current, etc., process parameters such as gas chemistry, flow rates, pressure, RF power, etc., and particularly timing control with respect to each of the parameters may be chosen to obtain desired film properties and throughput requirement. One example of the timing control, as discussed above, is to strike and sustain helium plasma within the process chamber with RF power before turning on the ESC voltage so that the substrate is heated (by helium plasma bombardment) to a high temperature that matches the ESC surface temperature to minimize the thermal shock, leading reduced surface stress before chucking occurs. An exemplary chucking sequence may include providing different ESC voltages according to a predetermined recipe for optimal film deposition results where a spike ESC voltage may be used at the beginning of the chucking step to quickly chuck and flatten the bowing substrate, while a lower ESC voltage is used in the later process steps to maintain clamping force and to be ready for substrate release from a low chucking voltage. For example, a spike ESC voltage of about 800V may be used at the beginning of the chucking step for about 1 second to about 45 seconds for a pre-chucking step, followed by a lower ESC voltage of about 200V to about 700V for about 35 seconds to about 65 seconds for a PECVD process. In some examples, the chucking sequence may be a three-step chucking sequence where the first two chucking steps each use a ESC voltage of about 800V for about 1 second to about 45 seconds, respectively, followed by a third chucking step using a ESC voltage of about 200V to about 700V for about 35 seconds to about 65 seconds. The processing time of the lower ESC voltage or the third chucking step may be shorter or longer, depending upon the PECVD process.

The apparatus as described in this disclosure may be used to generate Advanced Patterning Films, typically referred to as APF, that are used for hard masks of dielectric materials for lithography applications in a semiconductor manufacturing process. The apparatus can also be used to generate multiple layers of film depositions typically referred to as the staircase films that are used for gate stack of dielectric materials for memory devices. One exemplary gate stack film has multiple, alternative layers of oxide and polysilicon films. Another exemplary gate stack films has multiple, alternative layers of oxide and nitride films. It is recognized that due to the accumulated stress each layer is deposited on the previous layer, or layers, a silicon substrate may become bowed during the process or at the end of the process leading to a failure to meet with the required bow specification. The ideal bow specification of the gate stack is neutral bow or neutral stress after a number of alternative layers are deposited under high temperature. For example, if a 60-layer gate stacks process can reach neutral stress, it is typical that at higher number of layers may lead to worse wafer bow depending upon the particular process conditions. As such, deposition apparatus which employs the electrostatic chuck as disclosed in this disclosure helps to extend the number of layers one can process with controlled wafer bow or stress at the end of the process.

Embodiments of the present disclosure provide an improved electrostatic chuck (ESC) for maintaining a flatness of a substrate being processed in a plasma reactor at high temperatures. The improved electrostatic chuck is composed of a specific grade aluminum nitride material which provides optimized chucking performance around 600° C. or above during a deposition or etch process, or any other process that employ both high operating temperature and substrate clamping features. The improved electrostatic chuck has been proved to be able to generate sufficient clamping force to act upon the substrate so that the substrate becomes substantially flat, and is maintained substantially parallel with respect to the said ESC surface, regardless of whether the said substrate is flat or exhibited various degrees of bowing before processing.

While the foregoing is directed to embodiments of the present disclosure, other and further embodiments of the disclosure may be devised without departing from the basic scope thereof, and the scope thereof is determined by the claims that follow.

The invention claimed is:

1. An electrostatic chuck, comprising:
 a chuck body comprising aluminum nitride, between 3 ppm and 48 ppm silicon (Si), between 2 ppm and 16 ppm iron (Fe), between 5 ppm and 225 ppm calcium (Ca), and between 0.01 ppm and 805 ppm yttrium (Y), the chuck body having a volume resistivity value of $1\times10^9$ ohm-cm to $1\times10^{12}$ ohm-cm in a temperature range of 450° C. to 650° C., and a bulk density in the range of from 3.15 q/cc to 3.45 q/cc;

an insulating layer deposited on the chuck body to form a substrate supporting surface;

a support stem extending from the chuck body opposite the substrate supporting surface; and an electrode embedded in and surrounded by the chuck body.

2. The electrostatic chuck of claim 1, wherein the chuck body has a heat conductivity value between 60 W/m-K and 190 W/m-K.

3. The electrostatic chuck of claim 1, wherein the substrate supporting surface of the chuck body further comprises:

a plurality of square-shaped protrusions each having a length of 0.05 mm to 5 mm and a width of 0.05 mm to 5 mm.

4. The electrostatic chuck of claim 1, wherein the chuck body has a relative dielectric constant of 8 to 10.

5. The electrostatic chuck of claim 1, wherein the chuck body further comprises Mg, K, Na, Cr, Mn, Ni, Cu, and Zn.

6. The electrostatic chuck of claim 1, wherein the chuck body further comprises Na and Cr.

7. The electrostatic chuck of claim 6, wherein the content of Na is between 0.01 ppm and 5.4 ppm and the content of Cr is between 0.01 ppm and 3 ppm.

8. The electrostatic chuck of claim 6, wherein the chuck body further comprises Mg, K, Mn, Ni, Cu and Zn, and the content of each Mg, K, Mn, Ni, Cu and Zn is less than 1 ppm.

9. The electrostatic chuck of claim 1, wherein the insulating layer comprises a dielectric material or a ceramic material.

10. The electrostatic chuck of claim 9, wherein the insulating layer comprises yttrium oxide, yttrium-aluminum-garnet, or aluminum oxide silicon magnesium yttrium.

11. The electrostatic chuck of claim 1, wherein a peripheral edge and a bottom surface of the chuck body are coated with an insulating layer made of a dielectric material or a ceramic material.

12. The electrostatic chuck of claim 1, wherein the chuck body comprises aluminum nitride, Mg, and Na, wherein a content of the Na is between 0.01 ppm and 0.9 ppm.

13. An electrostatic chuck, comprising:

a chuck body having a substrate supporting surface, wherein the chuck body has a volume resistivity value of $1\times10^9$ ohm-cm to $1\times10^{12}$ ohm-cm in a temperature range of 450° C. to 650° C., a bulk density in the range of from 3.15 g/cc to 3.45 g/cc, and a heat conductivity value between 60 W/m-K and 190 W/m-K, and wherein the chuck body is composed of aluminum nitride and further comprises Si, Fe, Ca, and Y, and the content of Si is between 3 ppm and 48 ppm, the content of Fe is between 2 ppm and 16 ppm, the content of Ca is between 5 ppm and 225 ppm, and the content of Y is between 0.01 ppm and 805 ppm;

a support stem extending from the chuck body opposite the substrate supporting surface; and an electrode embedded in and surrounded by the chuck body.

14. An electrostatic chuck, comprising:

an aluminum nitride body having a substrate supporting surface, the aluminum nitride body comprising between 3 ppm and 48 ppm silicon (Si), between 2 ppm and 16 ppm iron (Fe), between 5 ppm and 225 ppm calcium (Ca), and between 0.01 ppm and 805 ppm yttrium (Y), wherein the aluminum nitride body has a volume resistivity value of $1\times10^9$ ohm-cm to $1\times10^{12}$ ohm-cm in a temperature range of 450° C. to 650° C. and a bulk density in the range of from 3.15 g/cc to 3.45 g/cc;

an insulating layer deposited over at least a peripheral edge of the substrate supporting surface; and an electrode embedded in and surrounded by the aluminum nitride body.

15. The electrostatic chuck of claim 14, wherein the aluminum nitride body has a heat conductivity value 170 W/m-K.

16. The electrostatic chuck of claim 14, wherein the aluminum nitride body further comprises Mg, K, Mn, Ni, Cu and Zn.

17. The electrostatic chuck of claim 14, wherein the insulating layer comprises silicon oxide, quartz, glass, aluminum oxide, silicon nitride, yttrium oxide, yttrium-aluminum-garnet, titanium oxide, titanium nitride, silicon carbide, aluminum oxide silicon magnesium yttrium, magnesium oxide, zirconia, titanium carbide, boron carbide, or boron nitride.

* * * * *